United States Patent
Okada et al.

(10) Patent No.: US 6,809,354 B2
(45) Date of Patent: Oct. 26, 2004

(54) SEMICONDUCTOR DEVICE

(75) Inventors: Tetsuya Okada, Kumagaya (JP); Mitsuhiro Yoshimura, Oizumi-machi (JP); Tetsuya Yoshida, Oizumi-machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/460,666

(22) Filed: Jun. 13, 2003

(65) Prior Publication Data

US 2004/0031993 A1 Feb. 19, 2004

(30) Foreign Application Priority Data

Jun. 14, 2002 (JP) ........................................ 2002-173774

(51) Int. Cl.[7] .............................................. H01L 29/76
(52) U.S. Cl. ........................ 257/213; 257/263; 257/328; 257/401
(58) Field of Search ................................ 257/213, 124, 257/129, 130, 168, 263, 266, 328, 330, 331, 332, 396, 401

(56) References Cited

U.S. PATENT DOCUMENTS

| | | | | |
|---|---|---|---|---|
| 5,405,794 A | * | 4/1995 | Kim | 438/270 |
| 5,430,315 A | * | 7/1995 | Rumennik | 257/331 |
| 6,211,018 B1 | * | 4/2001 | Nam et al. | 438/270 |
| 2002/0195657 A1 | * | 12/2002 | Williams et al. | 257/332 |

* cited by examiner

Primary Examiner—Tuan H. Nguyen
(74) Attorney, Agent, or Firm—Morrison & Foerster LLP

(57) ABSTRACT

In a semiconductor device, a variable-potential insulated electrode and a gate region are kept at the same potential through an aluminum layer. This device is mainly used as a voltage-driving type semiconductor device. By varying the voltage applied to the variable-potential insulated electrode through a gate electrode, a conductive path is formed in a channel region to switch on the device. The channel region turns into an N-type region when a positive potential is applied to the gate electrode, and turns into a pseudo P-type region when a ground potential or negative potential is applied to the gate electrode.

10 Claims, 7 Drawing Sheets

⊕ : free carriers (holes)   ⊖ : free carriers (electrons)
+ : ionized donor          − : ionized acceptor Prior Art Prior Art

SEMICONDUCTOR DEVICE

BACKGROUND OF THE INVENTION

1. Field of the Invention

This invention relates to a semiconductor device of a voltage-driven type that has a low ON-resistance and a rush current protecting function, and is driven at a low voltage.

2. Description of the Related Art

Structures of conventional devices in this field are known as a normally-off type transistor having excellent controllability and low on-resistance at switching time. Such structures are described in, for example, Japanese Laid-Open Patent Publication No. Hei 6-252408.

FIG. 6A is a perspective view showing the structure of such a conventional semiconductor device, and FIG. 6B is its plan view. As shown in FIG. 6A, an $N^-$-type epitaxial layer 52 is formed on an $N^+$-type semiconductor substrate 51. A plurality of trenches 57 are formed in the epitaxial layer 52 so as to be disposed in parallel to one another at an equal interval from the surface. The substrate 51 is used as a drain pickup region, and the epitaxial layer 52 is mainly used as a drain region 53. The trenches 57 are formed so that the side walls thereof are substantially vertical to the surface of the epitaxial layer 52, and insulating films 56 are formed in the inner walls of the trenches 57. Furthermore, for example, polycrystal silicon (polysilicon) doped with P-type impurities is deposited in the trenches 57. The polysilicon in the trenches 57 is electrically connected to source regions 54, for example, through aluminum (Al) wiring, on the surface of the epitaxial layer 52. Therefore, the P-type polysilicon in the trenches 57 is used as a fixed potential insulated electrodes 55 kept at the same potential as a source electrode S. The epitaxial layer 52 located between the plurality of trenches 57 is used as channel regions 58.

As shown in FIGS. 6A and 6B, a plurality of gate regions 59 are spaced from the source regions 54 and disposed at a fixed interval in the epitaxial layer 52 adjacent to the insulating films 56. As shown in FIG. 6B, each of the fixed potential insulated electrodes 55 has a comb-shape, and the teeth of the comb-shape extend to the right and left sides in the horizontal direction of the drawing with the center portion of the fixed potential insulated electrode 55 aligning in the vertical direction of the drawing (hereinafter referred to as an axial portion). That is, each of the gate regions 59 is formed so as to be overlapped with a part of the end portions of the corresponding comb teeth of the fixed potential insulated electrodes 55 extending from both sides, and in contact with the insulating film 56.

Next, the sectional structure and operation of this conventional semiconductor device will be described with reference to FIGS. 7A and 7B. FIG. 7A is a cross-sectional view taken along line X—X of FIG. 6B, and FIG. 7B is a cross-sectional view taken along line Y—Y of FIG. 6B.

As shown in FIG. 7A, the regions surrounded by the trenches 57 in the surface region of the epitaxial layer 52 correspond to the channel regions 58, an arrow H represents the thickness of the channels, and an arrow L represents the length of the channels. For example, an Al layer 60 is brought into ohmic contact with the back surface of the $N^+$-type substrate 51 used as the drain pickup region, and a drain electrode D is formed through the Al layer 60. On the other hand, an Al layer 61 is formed on the surface of the epitaxial layer 52 so as to come into ohmic contact with the source regions 54 and the fixed potential insulated electrodes 55, and the potential of the fixed potential insulated electrodes 55 is fixed to the potential of the source electrode S.

As shown in FIG. 7B, a silicon oxide film 62 is deposited on the surface of the epitaxial layer 52 in addition to the surfaces of the gate regions 59. Furthermore, a gate electrode G formed of Al or the like is formed through contact holes provided in the silicon oxide film 62 on the gate regions 59. The broken line in FIG. 7B shows the range of the fixed potential insulated electrodes 55.

Next, the operational principle of the conventional semiconductor device will be described. First, the OFF state of the semiconductor device will be described. As described above, the current path of the semiconductor device includes the $N^+$-type substrate 51 serving as the drain pickup region, the drain region 53 comprising the $N^-$-type epitaxial layer 52, the $N^-$-type channel regions 58 located between the trenches 57 in the surface region of the epitaxial layer 52, and the source regions 54 formed on the surfaces of the $N^-$-type channel regions 58. That is, all the regions are of N-type. This structure may provide a superficial understanding that if a positive voltage is applied to the drain electrode D and the device is operated while the source electrode S is grounded, it is impossible to set the device to an OFF state.

However, as described above, the N-type regions of the source regions 54 and the channel regions 58 and the P-type regions corresponding to the fixed potential insulated electrodes 55 are connected to one another through the Al layer 61 and kept at the same potential. Therefore, in the channel regions 58 around the fixed potential insulated electrodes 55, depletion layers are spread so as to surround the fixed potential insulated electrode 55 due to the difference in work function between $P^+$-type polysilicon and the $N^-$-type epitaxial layer 52. That is, by adjusting the interval width between the trenches 57 forming the fixed potential insulated electrodes 55, in other words, the channel width H, the channel regions 58 are fully filled with the depletion layers extending from the fixed potential insulated electrodes 55 at both sides. The channel regions 58 fully-filled with the depletion layers become pseudo P-type regions.

With this structure, a PN junction separation structure is formed from the $N^-$-type drain region 53 and the $N^+$-type source regions 54 by using the channel regions 58 serving as the pseudo P-type regions. That is, since the pseudo P-type regions are formed in the channel regions 58, the semiconductor device is kept at a shutoff state at (OFF state) the initial stage.

Next, the transfer state from OFF to ON in the semiconductor device will be described. First, a positive voltage is applied to the gate electrode G, which is initially at ground voltage. Accordingly, free carriers (holes) are introduced from the gate regions 59. As described above, the free carriers (holes) are-attracted by ionized acceptors and flow into the interface of the insulating films 56. By filling the free carriers (holes) at the interfaces of the insulating films 56 of the channel regions 58, only the ionized acceptors and free carriers (holes) in the $P^+$-type polysilicon regions are paired to form an electric field. Therefore, free carriers (electrons) exist from the farthest region from the insulating film 56 in each channel region 58, in other words, from the center area of the channel region 58, and thus a neutral region appears. As a result, the depletion layers of the channel regions 58 are diminished, the channels are opened from the center regions and the free carriers (electrons) move from the source regions 54 to the drain region 53, so that main current flows.

The free carriers (holes) instantaneously travel along the wall surfaces of the trenches 57 as paths, and the depletion layers spreading from the fixed potential insulated electrodes 55 to the channel regions 58 are diminished. Thus, the channels open. Furthermore, when a voltage of a predetermined value or higher is applied to the gate electrode G, the PN junctions constructed by the gate regions 59, the channel regions 58 and the drain region 53 are forwardly biased. The free carriers (holes) are directly injected into the channel regions 58 and the drain region 53. As a result, a number of free carriers (holes) are distributed in the channel regions 58 and the drain region 53, and conductivity modulation occurs, so that the main current flows with low ON-resistance.

Finally, the transfer state from ON to OFF of the semiconductor device will be described.

In order to turn off the semiconductor device, the potential of the gate electrode G is set to the ground voltage (0V) or negative potential. By the conductivity modulation, a large number of free carriers (holes) existing in the drain region 53 and the channel regions 58 are extinguished, or passed through the gate regions 59 and discharged to the outside of the device. Accordingly, the channel regions are fully filled with the depletion layers again, and become pseudo P-type regions once more, so that the withstanding voltage is maintained and the main current is stopped.

As described above, the conventional semiconductor device is operated by making free carriers (holes) flow into and from the gate regions 59, and thus it is a current-driven type semiconductor device. However, in the case of the current-driven type semiconductor device, it is difficult to drive the semiconductor device because of difficulties such as power loss in a driving circuit or the like.

SUMMARY OF THE INVENTION

The invention provides a semiconductor device that includes a semiconductor substrate of a first conduction type and an epitaxial layer of the first conduction type disposed on the semiconductor substrate. At least a part of the epitaxial layer and a part of the semiconductor substrate are configured to function as a drain region. The device also includes a plurality of variable-potential insulated electrodes. Each of the electrodes fills in a corresponding trench formed in the epitaxial layer and includes a semiconductor of a second conduction type. The trenches is substantially parallel to each other, and an insulating film is disposed between each of the electrodes and an inner wall of the corresponding trench. The device also includes a plurality of source regions of the first conduction type formed in the epitaxial layer. At least one of the source regions is disposed between a corresponding couple of the trenches. The device also includes a plurality of gate regions of the second conduction type formed in the epitaxial layer. Each of the gate regions is disposed away from the corresponding source region and adjacent at least a portion of the corresponding insulating film. The gate regions are configured to be at a same potential as the variable-potential insulated electrodes. The device further includes a plurality of channel regions disposed in the epitaxial layer. At least one of the channel regions is disposed between a corresponding couple of the trenches and at least below the corresponding source region.

The invention also provides a semiconductor device that includes a semiconductor substrate having a surface of a first conduction type. A drain region is formed in the surface. The device also includes a plurality of variable-potential insulated electrodes. Each of the electrodes fills in a corresponding trench formed in the surface of the semiconductor substrate and has a semiconductor of a second conduction type. The trenches are substantially parallel to each other, and an insulating film is disposed between each of the electrodes and an inner wall of the corresponding trench. The device further includes a plurality of source regions of the first conduction type formed in the surface of the semiconductor substrate. Each of the source regions is disposed between a corresponding couple of the trenches. The device also includes a plurality of gate regions of the second conduction type formed in the surface of the semiconductor substrate. Each of the gate regions is disposed away from the corresponding source region and adjacent at least a portion of the corresponding insulating film. The gate regions are configured to be at the same potential as the variable-potential insulated electrodes. The device further includes a plurality of channel regions disposed in the surface of the semiconductor substrate. Each of the channel regions is disposed between a corresponding couple of the trenches and at least below the corresponding source region.

DETAILED DESCRIPTION OF THE INVENTION

Figure 1A:
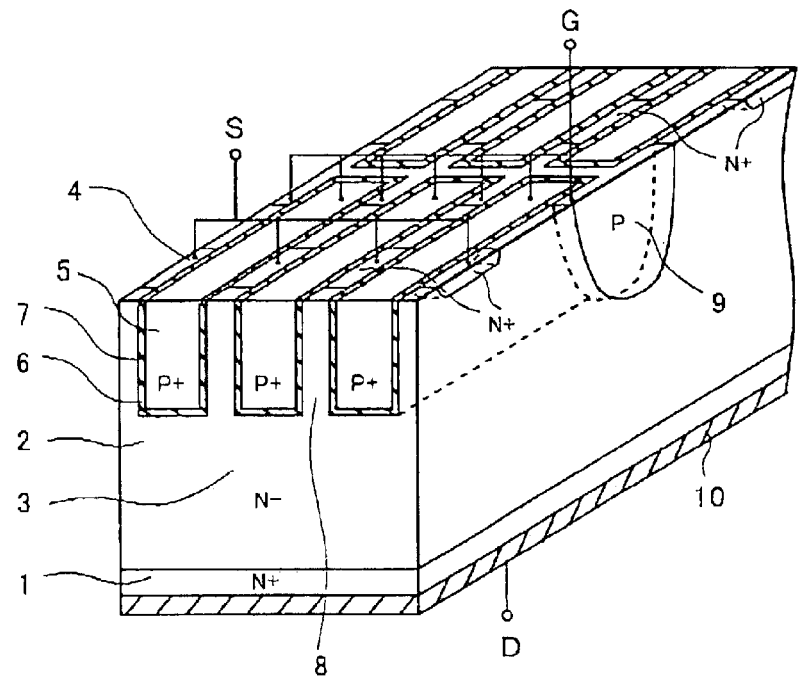
FIG. 1A is a perspective view of a semiconductor device of a first embodiment of this invention.
Figure 1B:
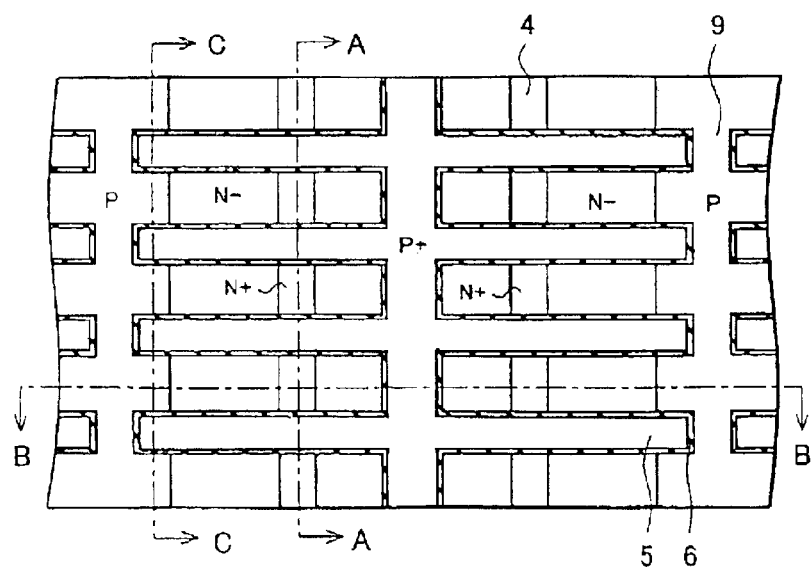
FIG. 1B is a plan view of the device of FIG. 1A.

A semiconductor device of an embodiment of this invention will be described in details with reference to FIGS. 1A–5B. FIG. 1A is a perspective view showing the structure of the semiconductor device according to this invention, and FIG. 1B is its top view. As shown in FIG. 1A, an $N^-$-type epitaxial layer 2 is deposited on an $N^+$-type semiconductor substrate 1. A plurality of trenches 7 are formed in the epitaxial layer 2 so as to be disposed in parallel to one another at an equal interval from the surface. The substrate 1 is used as a drain pickup region, and the epitaxial layer 2 is mainly used as a drain region 3. The trenches 7 are formed so that the side walls thereof are substantially vertical to the surface of the epitaxial layer 2, and insulating films 6 are formed in the inner walls of the trenches 7. Furthermore, for example, polycrystal silicon (polysilicon) doped with P-type impurities is deposited in the trenches 7. As described later in detail, the polysilicon in the trenches 7 is electrically connected to gate regions 9, for example, through aluminum (Al) layer, on the surface of the epitaxial layer 2. Therefore, the P-type polysilicon in the trenches 7 is used as variable potential insulated electrodes 5, and the voltage applied to the electrodes 5 varies in response to the voltage applied to the gate electrode G. The epitaxial layer 2 located between the plurality of trenches 7 is used as channel regions 8. A source region 4 made of an $N^+$-type diffusion region is formed on the surface of each channel region 8. In this embodiment, a semiconductor substrate refers to the substrate 1 and the epitaxial layer 2 formed on the substrate 1.

As shown in FIGS. 1A and 1B, the gate regions 9 are spaced from the source regions 4 and provided in the epitaxial layer 2 adjacent to the insulating films 6 at a fixed interval. As shown in FIG. 1B, each of the variable-potential insulated electrodes 5 has a comb shape, and the comb teeth thereof extend to the right and left sides in the horizontal direction of the drawing with the central portion of the variable-potential insulated electrode 5 aligning in the vertical direction of the drawing (hereinafter referred to as an axial portion). That is, in this embodiment, the gate regions 9 are formed so as to be overlaid on forming regions with parts of both end portions of each of the comb teeth of each variable-potential insulated electrode 5 and adjacent to the insulating films 6 in these regions. In other words, the axis portion of each variable-potential insulated electrode 5 is spaced from two adjacent gate regions 9 at an equal distance, and source regions 4 are provided at both sides of the axis portion so as to be spaced at a desired distance.

Figure 2A:
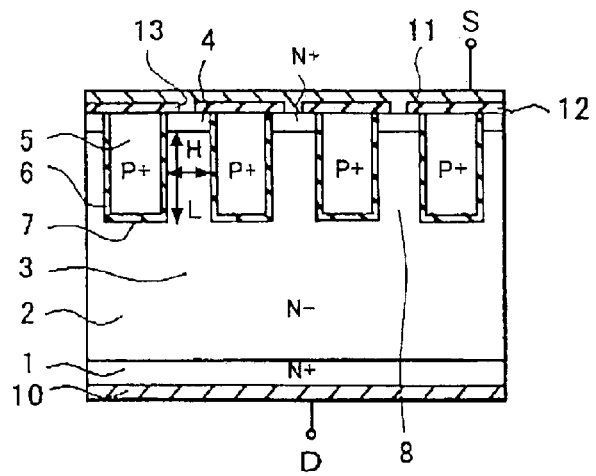
FIGS. 2A, 2B and 2C are cross-sectional views of the device of FIG. 1A.

Next, the sectional structure and operation of the semiconductor device according to this embodiment will be described with reference to FIGS. 2A, 2B and 2C. FIG. 2A is a cross-sectional view taken along line A—A of FIG. 1B, FIG. 2B is a cross-sectional view taken along line B—B of FIG. 1B, and FIG. 2C is a cross-sectional view taken along line C—C of FIG. 1B.

As shown in FIG. 2A, the region surrounded by each trench 7 in the surface region of the epitaxial layer 2 corresponds to the channel region 8. An arrow H represents the thickness of the channel, and an arrow L represents the length of the channel. That is, the channel thickness H is the interval between the trenches 7 facing each other in the channel region 8, and the channel length L is the distance from the bottom surface of the source region 4 to the bottom surface of the variable-potential insulated electrode 5 along the side wall of the trench 7. Furthermore, for example, an Al layer 10 comes into ohmic contact with the back surface of the $N^+$-type substrate 1 used as the drain pickup region, and a drain electrode D is formed through the Al layer 10. A silicon oxide film 12 as an insulating film is formed on the surface of the epitaxial layer 2. Al layer 11 comes into ohmic contact with the source regions 4 through contact holes formed in the silicon oxide film 12. Since the conductive path formed in the channel region 8 can intercept current or control the current amount, the shape of the variable-potential insulated electrode 5, the shape of the source region 4, or the like, which constitute a unit cell could be arbitrarily set if the above condition is satisfied. As described in detail later, in this embodiment, a conductive path refers to a main-current flow path formed in each channel region 8.

Figure 2B:
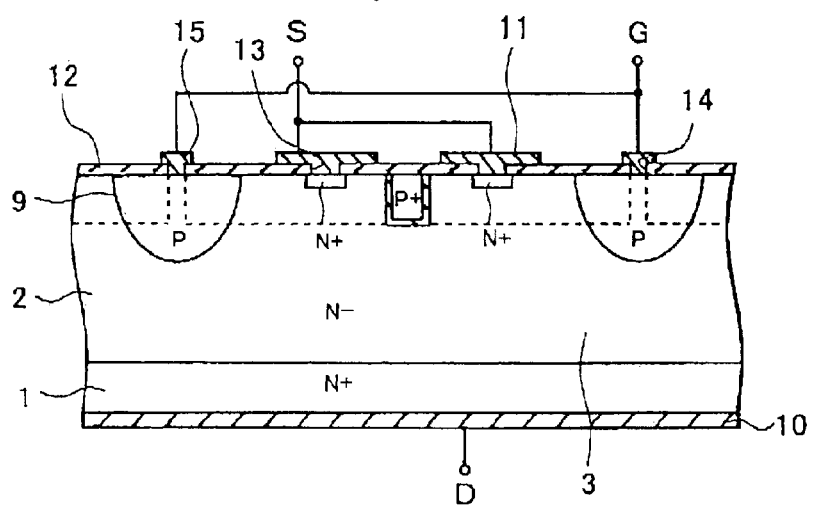

As shown in FIG. 2B, the silicon oxide film 12 is deposited on the surface of the epitaxial layer 2, including the surfaces of the gate regions 9. In the gate regions 9, Al layers 15 are formed on the silicon oxide film 12, and a gate electrode G is formed through contact holes 14 formed in the silicon oxide film 12. A broken line of FIG. 2B shows the range of the variable-potential insulated electrodes 5. As shown in the figures, the corner portions of the insulating films 6 in the cross-sectional view and the plan view are illustrated as being a right angle. However, the figures are only for schematic representation and the corner portions may be truncated or rounded. In this embodiment, it is preferable to round the corner portions in order to suppress concentration of the electric field.

Figure 2C:
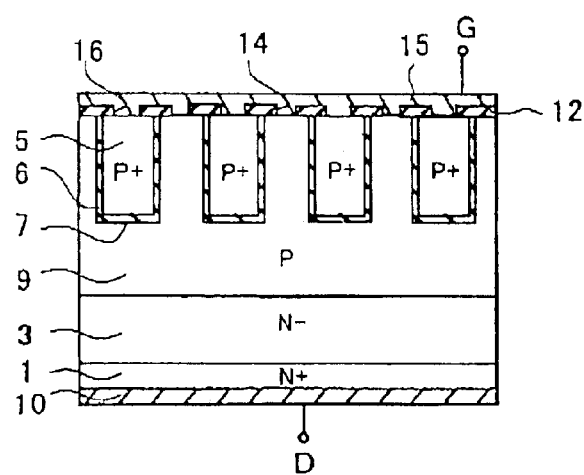

As shown in FIG. 2C, the silicon oxide film 12 is deposited on the surface of the epitaxial layer 2, including the surfaces of the gate regions 9. Contact holes 14 formed on the gate regions 9 and contact holes 16 formed on the variable-potential insulated electrodes 5 are shown in the silicon oxide film 12 in this cross-sectional view. That is, as shown in FIG. 1B, the gate regions 9 are formed to extend in the vertical direction of the drawing, and the Al layers 15 are likewise formed in parallel to the gate regions 9. The Al layers 15 come into ohmic contact with the variable-potential insulated electrodes 5 and the gate regions 9 through the contact holes 14 and 16, and keep the variable-potential insulated electrodes 5 and the gate regions 9 at the same potential.

In this embodiment, as shown in FIG. 2A through FIG. 2C, the Al layers 11 disposed substantially in parallel to the source regions 4 and the Al layers 15 disposed substantially in parallel to the gate regions 9 are formed on the silicon oxide film 12 on the surface of the epitaxial layer 2. In the semiconductor device according to this embodiment, a drain terminal through the Al layer 10, a source terminal through the Al layer 11 and a gate terminal through the Al layer 15 are the external terminals of the device. By applying a voltage to the source terminal, the gate terminal and the drain terminal from the outside of the semiconductor device, the ON-operation and OFF-operation of the semiconductor device are performed.

Next, the operation principle of the semiconductor device of this invention will be described. First, the OFF-state of the semiconductor device will be described. As described above, the current path of the semiconductor device includes the $N^+$-type substrate 1 serving as the drain pickup region, the drain region 3 made of the $N^-$-type epitaxial layer 2, the $N^-$-type channel regions 8 located between the plurality of trenches 7 in the surface area of the epitaxial layer 2 and the $N^+$-type source regions 4. That is, all the regions are of N-type.

In the OFF-state, the N-type regions of the source regions 4 and the channel regions 8 and the P-type regions of the variable-potential insulated electrodes 5 are set practically at the same potential as the source electrode S when the gate electrode G is set to the ground voltage. Alternatively, the gate electrode G, and thus the variable-potential insulated electrodes 5, are set to a negative potential with respect to the source electrode S. Therefore, in the channel regions 8 around the variable-potential insulated electrodes 5, depletion layers are spread so as to surround the variable-potential insulated electrodes 5 due to the difference in work function between $P^+$-type polysilicon and the $N^-$-type epitaxial layer 2. That is, by adjusting the width between the trenches 7 of the variable-potential insulated electrodes 5, that is, the channel width H, the channel regions 8 are fully filled with the depletion layers extending from the variable-potential insulated electrodes 5 at both sides. The channel regions 8 fully-filled with the depletion layers become pseudo P-type regions, as described below.

With this structure, a PN junction separation structure is formed from the $N^-$-type drain region 3 and the $N^+$-type source regions 4 by using the channel regions 8 serving as the pseudo P-type regions. That is, since the pseudo P-type regions are formed in the channel regions 8, the semiconductor device is kept at a shutoff state (OFF state) at the initial stage. When the semiconductor device is turned off, a positive voltage is applied to the drain electrode D, and the source electrode S and the gate electrode G are grounded. Under this condition, a depletion layer extends from the interface between the channel region 8 acting as the pseudo P-type region and the drain region 3 toward the bottom of the device due to the application of a reverse bias. The formation of this depletion layers affects the withstanding voltage characteristic of the semiconductor device.

Figure 3A:
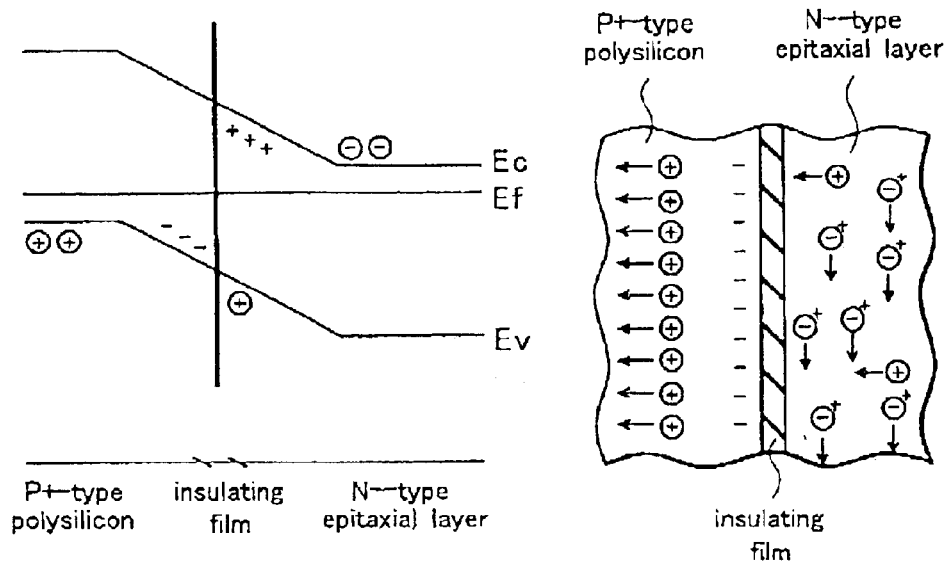
FIG. 3A is an energy band diagram of the device of FIG. 1A to describe a formation of depletion layer.
Figure 3B:
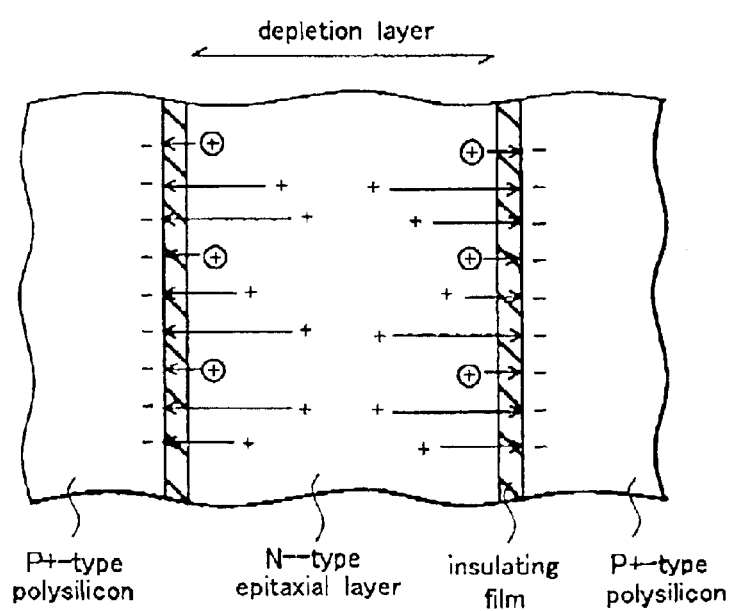
FIG. 3B shows a channel region during OFF-time.

The pseudo P-type regions of this embodiment will be described with reference to FIGS. 3A and 3B. FIG. 3A is an energy band diagram in the channel regions 8 during OFF state, and FIG. 3B is a diagram schematically showing a depletion layer formed in a channel region 8 during OFF state. The $P^+$-type polysilicon region serving as the variable-potential insulated electrode 5 and the $N^-$-type epitaxial layer 2 serving as the channel region 8 face each other through the insulating film 6. The gate electrode G is set to the ground voltage, thus it is set to substantially the same potential as the source electrode S. Alternatively, the gate electrode G is set to negative potential with respect to the source electrode S. Therefore, the depletion layers are formed on the peripheral portions of the trenches 7 due to the difference in work function therebetween, and a small number of free carriers (holes) existing in the depletion layers make the depletion layers P-type regions.

Accordingly, when the $P^+$-type polysilicon regions and the $N^-$-type epitaxial layer 2 region are set to the same potential, the energy band diagram shown in FIG. 3A is formed. First, in each $P^+$-type polysilicon region, a valence band is formed with a negative slope at the interface of the insulating film 6, and it shows that the potential energy at the interface of the insulating film 6 is high for the free carriers (holes). That is, the free carriers (holes) in each $P^+$-type polysilicon region cannot exist at the interface of the insulating film 6, and they are relegated to be far away from the insulating film 6. As a result, negative charges including ionized acceptors remain at the interface of the insulating film 6 of each $P^+$-type polysilicon region. The negative charges comprising the ionized acceptors exist at the interface of the insulating film 6 of the $P^+$-type polysilicon region. Accordingly, positive charges including ionized donors to be paired with the negative charges are required in the $N^-$-type epitaxial layer 2 region. Therefore, formation of the depletion layer is promoted from the interface of the insulating film 6 in each channel region 8.

However, since the concentration of impurities of the channel region 8 is equal to about $1.0 \times 10^{14}$ (/cm$^3$) and the thickness thereof is equal to about 1 μm, each channel region 8 is completely occupied by the depletion layer extending from the variable-potential insulated electrode 5 which is formed so as to surround the channel region 8. Practically, the formation of the depletion layer cannot produce in the channel region 8 the positive charges that match the ionized acceptors, and thus a small number of free carriers (holes) also exist. Accordingly, as shown in the figures, the ionized acceptors in the $P^+$-type polysilicon regions and the free carriers (holes) or ionized donors in the $N^-$-type epitaxial layer 2 are paired to form an electric field. As a result, the depletion layer formed from the interface of the insulating film 6 becomes the P-type region, and the channel region 8 filled with the depletion layer becomes the P-type region.

Next, the transfer state from OFF to ON of the semiconductor device will be described. First, a positive voltage is applied to the gate electrode G through the gate terminal, which is initially at the ground voltage. As shown in FIG. 2C, the Al layers 15 are in ohmic contact with the variable-potential insulated electrodes 5 and the gate regions 9 through the contact holes 14 and 16. Therefore, the same voltage is applied to the variable-potential insulated electrodes 5 from the gate electrode G. In the channel region 8 serving as the pseudo P-type region, the insulating film 6 is used as an insulating layer, and the conductive path is formed in the channel region 8 adjacent to the variable-potential insulated electrode 5. Accordingly, the drain region 3 and the source region 4 are conducted to each other through the conductive path of the channel region 8, and the free carriers (electrons) move from the source region 4 to the drain region 3, whereby the main current flows.

Here, the channel region 8 having the conductive path formed therein will be described. As described above, the channel region 8 becomes the pseudo P-type region by grounding the gate electrode G through the gate terminal or applying a negative potential to the gate electrode G in the OFF-state. In order to turn on the semiconductor device, a positive voltage is applied to the gate electrode G. At this time, by applying the positive voltage to the gate electrode G, the potential of the $P^+$-type polysilicon region is set higher than the potential of the $N^-$-type epitaxial layer 2 region. Therefore, when the semiconductor device is turned on, an N-type conductive path is formed on the face of the channel region 8 serving as the pseudo P-type region which is adjacent to the insulating film 6, and the free carriers (electrons) move from the source region 4 to the drain region 3 through the conductive path. Thus, the main current flows. It is expected that at this time at least two N-type regions different in carrier concentration are formed in the channel region 8. Because the conductive path has low resistance due to the existence of high-concentration electrons, the main current flows through the conductive path.

In the semiconductor device of this embodiment, by applying a positive voltage to the gate electrode G and further applying a voltage higher than a predetermined voltage to the gate electrode G, the free carriers (holes) are introduced from the gate regions 9. That is, the PN junctions formed by the gate regions 9 and the drain region 3 are forwardly biased. The free carriers (holes) are directly injected into the drain region 3, and a large number of free carriers (holes) are distributed in the drain region 3 to induce conductivity modulation and the main current flows with low ON resistance. Though this device is mainly driven by voltage as described above, the operation in the ON-state described herein allows the semiconductor device of this embodiment to have a current-driving function.

Finally, the transfer state from ON to OFF of the semiconductor device will be described. In order to turn off the semiconductor device, the potential of the gate electrode G is set to the ground voltage (0V) or a negative potential. At this time, just as with a conventional MOSFET (metal oxide semiconductor field effect transistor), the conductive path formed in the channel region 8 is extinguished, and the semiconductor device is set to the interception state (OFF state) again by the PN junction separation structure formed by the drain region 3 and the channel region 8 serving as the pseudo P-type region. In the drain region 3, a large number of free carriers (holes) existing as a result of the conductivity modulation are extinguished or discharged through the gate regions 9 to the outside of the device.

With the structure described above, the device of this embodiment may achieve a number of effects such as low-voltage drive, low resistance during ON-time, and also a rush current protecting function due to the formation of the PN junction between the gate region and the source region.

First, a low voltage drive of this device will be described. As described above, the PN junction separation structure is formed by setting the channel region 8 as the pseudo P-type region, setting the device to the interception state (OFF state) at the initial stage. However, as described with respect to the prior art, in the channel region 8 serving as the pseudo P-type region, a positive potential is applied to the gate electrode through the gate terminal during the ON operation, whereby the channel 8 returns to the N-type region. Accordingly, in the channel region 8 just after the ON operation, the N-type conductive path is formed in the pseudo P-type region. Thereafter, a high-concentration N-type conductive path is formed in the channel region 8 which becomes the N-type region. The drain region 3 and the source region 4 are conducted to each other through the conductive path of the channel region 8, and the free carriers (electrons) move from the source region 4 to the drain region 3, whereby the main current flows.

Figure 4:
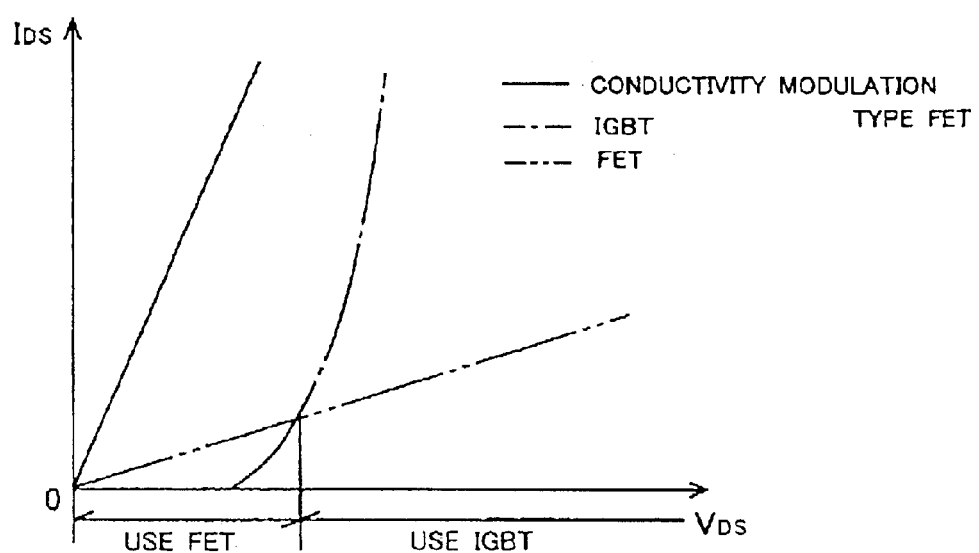
FIG. 4 is a voltage-current characteristic diagram of the device of FIG. 1A.

FIG. 4 is a voltage-current characteristic diagram that shows a conductivity modulation type MOSFET indicated by the solid line, IGBT (Insulated-Gate-Bipolar-Transistor) indicated by the chain line and MOSFET indicated by a chain double-dashed line. IGBT and MOSFET are voltage-driving type semiconductor devices. The conductivity modulation type MOSFET of this embodiment is a voltage-driving type, and also has current-driving type characteristics. For example, as shown in FIG. 4, in the case of the conventional voltage-driving type semiconductor devices, the voltage at the cross point between the chain line and the chain double-dashed line is set as a standard voltage although it is dependent on the use purpose, the application, or the like. MOSFET is used when the voltage between the drain and the source ranges from 0 to the voltage indicated at the cross point, and IGBT is used when the voltage is not less than the voltage indicated at the cross point.

However, the figure shows that the conductivity modulation type MOSFET of this embodiment is mainly of a voltage-driving type, and driven by a low voltage. This device has remarkably low resistance in the ON-state, and has a current-driving type characteristic as well. Therefore, large current can be achieved with a low voltage. For example, as compared with MOSFET having the same level of performance characteristics, the driving voltage of the conductivity modulation type MOSFET of this invention is about 1V whereas the driving voltage of MOSFET is about 10V. That is, this device can be driven by a low voltage by changing the channel region 8 to the pseudo P-type region or N-type region.

Second, the low resistance at the ON-state will be described. As shown in FIG. 2B, in the semiconductor device of this embodiment, when the device is turned off and right after being turned on, the conductive path is formed on the face of the channel region 8 serving as the pseudo P-type region which is adjacent to the insulating film 6, thereby connecting the source region 4 and the drain region 3. Thus, the operation during ON-time is performed. The free carriers (electrons) move from the source region 4 through the conductive path to the drain region 3, whereby the main current occurs. A conventional trench gate type MOSFET has a problem that the resistance during ON-time is not reduced below a certain value due to parasitic resistance in the drain region located below the trench region, that is, the drift region.

However, in the semiconductor device of this embodiment, by applying the voltage higher than a predetermined voltage to the gate electrode G as described above, the free carriers (holes) are introduced from the gate regions 9. The PN junctions formed by the gate regions 9 and the drain region 3 are forwardly biased, and the free carriers (holes) are directly injected into the drain region 3. Accordingly, a large number of free carriers (holes) are distributed in the drain region 3 serving as the drift region to induce conductivity modulation, and thus the main current flows with low ON-resistance.

Figure 5A:
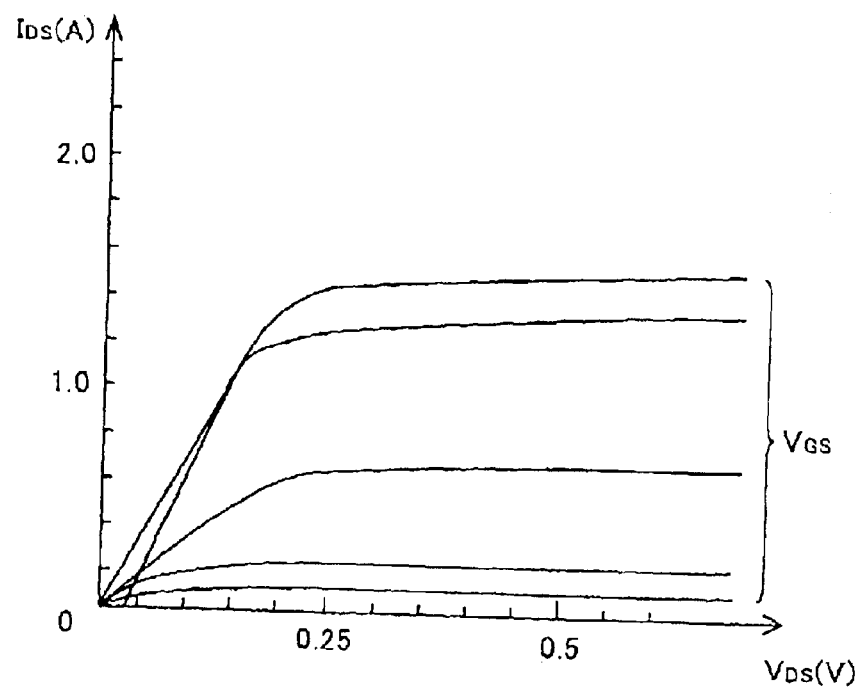
FIG. 5A shows I-V characteristics of the device of FIG. 1A.
Figure 5B:
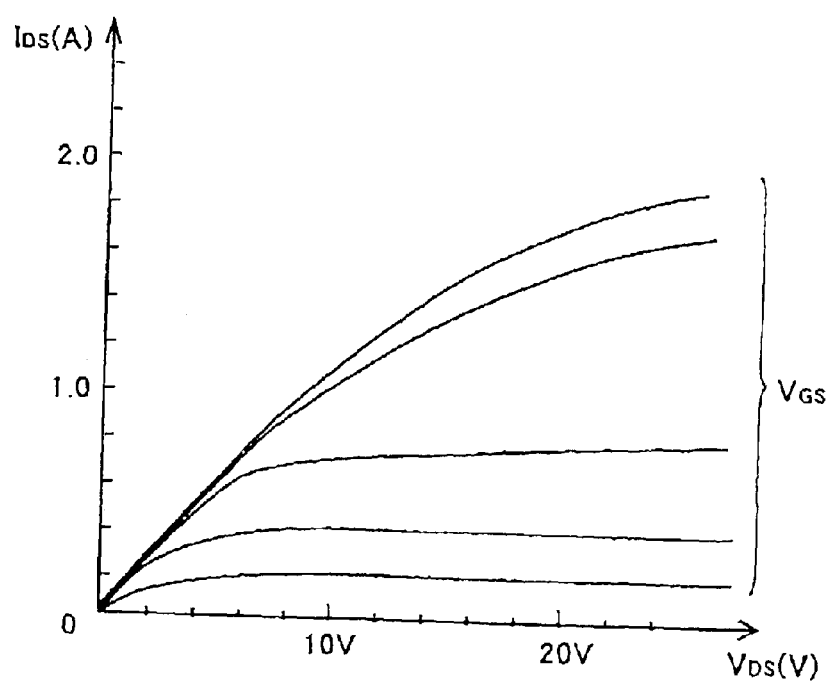
FIG. 5B shows I-V characteristics of a conventional MOSFET device.
Figure 6A:
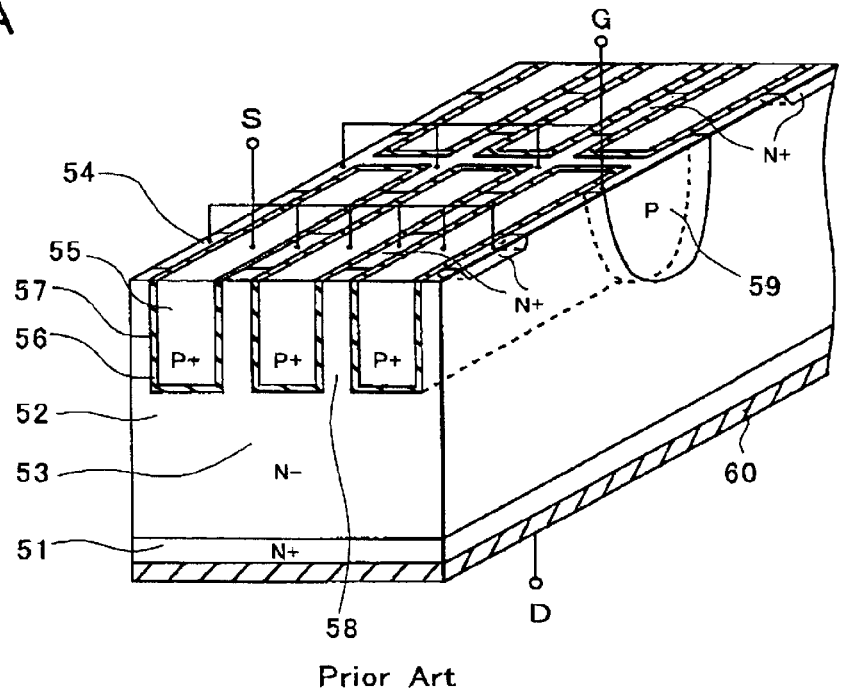
FIG. 6A is a perspective view of a conventional semiconductor device.
Figure 6B:
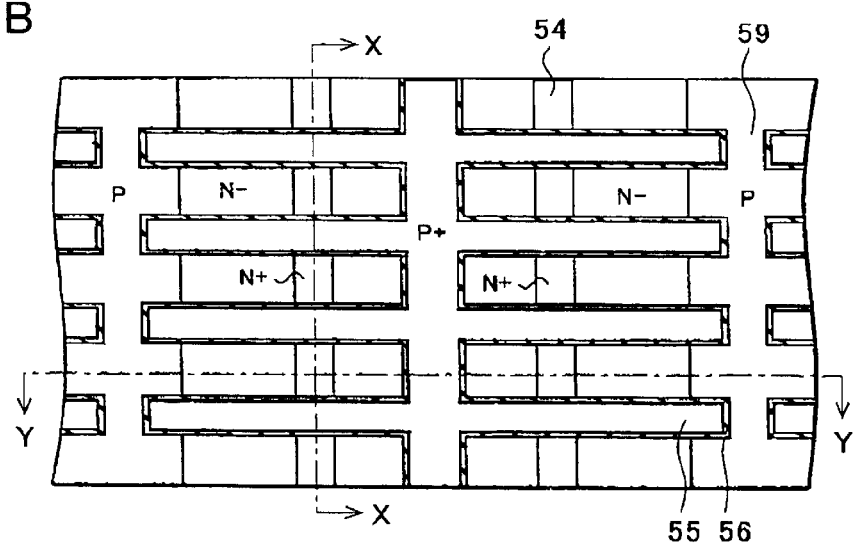
FIG. 6B is a plan view of the device of FIG. 6A.
Figure 7A:
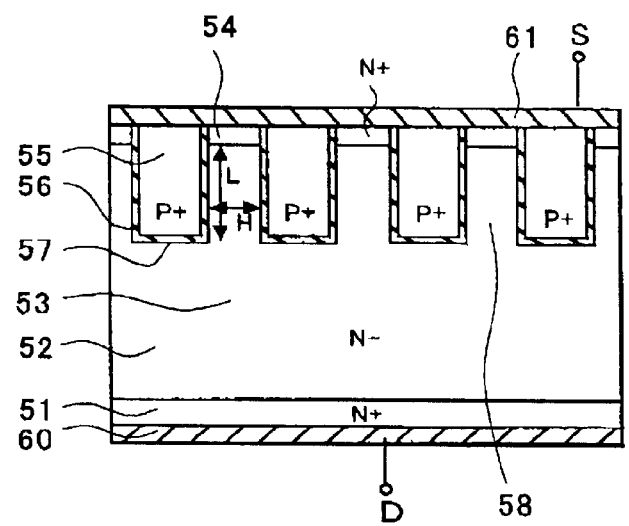
FIGS. 7A and 7B are cross-sectional views of the device of FIG. 6A.
Figure 7B:
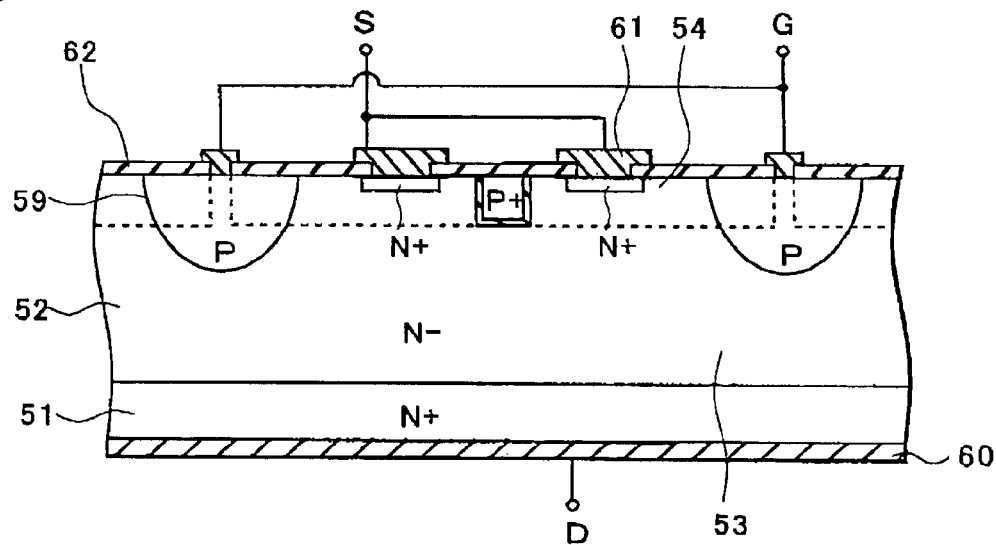

Specifically, FIG. 5A shows experimental data for determining the voltage-current characteristic of the conductivity modulation type MOSFET indicated by the solid line in FIG. 4, and FIG. 5B shows experimental data for determining the voltage-current characteristics of MOSFET indicated by the chain double-dashed line in FIG. 4. As shown in FIG. 5A, the conductivity modulation type MOSFET has an ON voltage of about 137 mV when current of 1.0 A flows. Therefore, the resistance value during ON-time in the conductivity modulation type MOSFET is about 0.137Ω. On the other hand, as shown in FIG. 5B, MOSFET has an ON voltage of about 8.09V when current of 1.0 A flows. Therefore, the resistance value during ON-time in MOSFET is about 8.09Ω. From the experimental data it is apparent that the conductivity modulation type MOSFET has a low resistance in the ON-state.

That is, according to this embodiment, the parasitic resistance during ON-time in the conductive path formed in the channel region 8 occurs, as is the case with the normal MOSFET. However, the parasitic resistance in the drift region, which contributes most to the parasitic resistance, can be reduced. As a result, the resistance during ON-time is low because the device also has the current-driving characteristics although the device of this embodiment is mainly voltage-driven.

Third, the rush current protecting function, which is achieved by forming the PN junction between the gate region and the source region, will be described. First, in the voltage-driving type semiconductor device, the main current is adjusted in accordance with the voltage applied between the gate and the source, as is the case with the conventional MOSFET. In the conventional device, when an excessive voltage is applied between the gate and the source, a rush current is generated, which damages the semiconductor device. Therefore, in a semiconductor device such as the conventional MOSFET or the like, a countermeasure to the rush current is taken by using a protection circuit such as a fuse or the like in combination.

However, in the semiconductor device of this embodiment, as described above, the Al layers 15 are in ohmic contact with the variable-potential insulated electrodes 5 and the gate regions 9, and the voltage of the variable-potential insulated electrodes 5 is varied in accordance with the voltage applied to the gate electrode G. As shown in FIGS. 2A–2C, the PN junction area formed by the gate region 9 and the drain region 3 and the area where the variable-potential insulated electrode 5 and channel region 8 face each other through the insulating film 6 form a parallel circuit. That is, a voltage is applied to the variable-potential insulated electrode 5 until the voltage reaches a certain value. However, when the voltage is above a forward bias value at the PN junction, no voltage above the forward bias value is applied to the variable-potential insulated electrode 5.

Specifically, it is apparent from FIG. 5A that the conductivity modulation type MOSFET of this embodiment is not dependent on the intensity of the main current and the intensity of the main current flowing is limited to an upper fixed limit value even when a driving voltage higher than a predetermined value is applied.

Accordingly, no voltage higher than a predetermined value is applied to the variable-potential insulated electrode 5, and the width of the conductive path formed in the channel region is limited to a certain fixed value. As a result, a main current larger than a predetermined current capacity does not flow between the source region 4 and the drain region 3 through the conductive path. In the semiconductor device of this embodiment, the rush current protecting function can be achieved without using any protection circuit such as a fuse in combination.

The main current can be adjusted by the thickness of the insulating film 6 or the like, and any design change may be made in accordance with a required application.

The above is a detailed description of a particular embodiment of the invention which is not intended to limit the invention to the embodiment described. It is recognized that modifications within the scope of the invention will occur to persons skilled in the art. Such modifications and equivalents of the invention are included within the scope of this invention.

What is claimed is:

1. A semiconductor device comprising:

a semiconductor substrate of a first conduction type;

an epitaxial layer of the first conduction type disposed on the semiconductor substrate, at least a part of the epitaxial layer and a part of the semiconductor substrate being configured to function as a drain region;

a plurality of variable-potential insulated electrodes, each of the electrodes filling in a corresponding trench formed in the epitaxial layer and comprising a semiconductor of a second conduction type, the trenches being substantially parallel to each other, and an insulating film being disposed between each of the electrodes and an inner wall of the corresponding trench;

a plurality of source regions of the first conduction type formed in the epitaxial layer, at least one of the source regions being disposed between a corresponding couple of the trenches;

a plurality of gate regions of the second conduction type formed in the epitaxial layer, each of the gate regions being disposed away from the corresponding source region and adjacent at least a portion of the corresponding insulating film, the gate regions being configured to be at a same potential as the variable-potential insulated electrodes; and a plurality of channel regions disposed in the epitaxial layer, at least one of the channel regions being disposed between a corresponding couple of the trenches and at least below the corresponding source region.

2. The semiconductor device of claim 1, wherein the trenches are disposed at an equal interval along a direction perpendicular to a longitudinal direction of the trenches.

3. The semiconductor device of claim 1, wherein the channel regions are configured to be switched on or off in response to a potential applied to the gate regions.

4. The semiconductor device of claim 3, wherein the channel regions are configured to turn into regions of the second conduction type when the gate electrodes are set at a same potential as the source regions or at a potential lower than the potential of the source regions.

5. The semiconductor device of claim 3, wherein the channel regions are so configured that a part of each of the channel regions adjacent the corresponding insulating film turns into a conducting region of the first conduction type when the gate electrodes are set at a potential higher than a potential of the source regions.

6. The semiconductor device of claim 5, wherein each of the conducting regions of the channel regions comprises a region of a higher carrier concentration and the rest of the corresponding channel region comprises a region of a lower carrier concentration.

7. The semiconductor device of claim 5, wherein a forward potential is applied between the gate regions and the drain region so as to limit a maximum potential applied to the variable-potential insulated electrodes.

8. The semiconductor device of claim 5, wherein the drain region is configured to modulate a conductivity of the channel regions.

9. The semiconductor device of claim 1, further comprising a metal connection disposed at least on the epitaxial layer and connecting the gate regions and the variable-potential insulated electrodes.

10. A semiconductor device comprising:

a semiconductor substrate comprising a surface of a first conduction type, the surface comprising a drain region;

a plurality of variable-potential insulated electrodes, each of the electrodes filling in a corresponding trench formed in the surface of the semiconductor substrate and comprising a semiconductor of a second conduction type, the trenches being substantially parallel to each other, and an insulating film being disposed between each of the electrodes and an inner wall of the corresponding trench;

a plurality of source regions of the first conduction type formed in the surface of the semiconductor substrate, at least one of the source regions being disposed between a corresponding couple of the trenches;

a plurality of gate regions of the second conduction type formed in the surface of the semiconductor substrate, each of the gate regions being disposed away from the corresponding source region and adjacent at least a portion of the corresponding insulating film, the gate regions being configured to be at a same potential as the variable-potential insulated electrodes; and a plurality of channel regions disposed in the surface of the semiconductor substrate, at least one of the channel regions being disposed between a corresponding couple of the trenches and at least below the corresponding source region.

* * * * *